/ United States Patent /

(12) United States Patent
Yeh et al.

(10) Patent No.: US 6,774,461 B2
(45) Date of Patent: Aug. 10, 2004

(54) METHOD OF REDUCING THICK FILM STRESS OF SPIN-ON DIELECTRIC AND THE RESULTING SANDWICH DIELECTRIC STRUCTURE

(75) Inventors: Ching-Fa Yeh, Hsinchu (TW);
Yueh-Chuan Lee, Hsinchu (TW);
Chih-Chuan Hsu, Hsinchu (TW);
Kwo-Hau Wu, Hsinchu (TW);
Shuo-Cheng Wang, Hsinchu (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 10/075,293

(22) Filed: Feb. 15, 2002

(65) Prior Publication Data

US 2002/0142580 A1 Oct. 3, 2002

(30) Foreign Application Priority Data

Feb. 21, 2001 (TW) ........................................ 90103958 A

(51) Int. Cl.[7] ............................................. H01L 23/58
(52) U.S. Cl. ........................ 257/635; 257/758; 257/644; 257/650

(58) Field of Search .................................. 257/530, 750, 257/758, 768, 769, 707, 635, 641, 650, 644, 666, 757, 760, 754; 438/624, 622, 637

(56) References Cited

U.S. PATENT DOCUMENTS

| | | | | |
|---|---|---|---|---|
| 5,567,660 A | * | 10/1996 | Chen et al. | 438/624 X |
| 6,187,663 B1 | * | 2/2001 | Yu et al. | 438/624 |
| 6,294,832 B1 | | 9/2001 | Yeh et al. | |
| 6,492,257 B1 | * | 12/2002 | Shields et al. | 438/622 |
| 6,521,524 B1 | * | 2/2003 | Wang et al. | 438/637 |

* cited by examiner

*Primary Examiner*—Long Pham
*Assistant Examiner*—(Vikki) Hoa B. Trinh
(74) *Attorney, Agent, or Firm*—Bacon & Thomas

(57) ABSTRACT

The present invention provides a technique to reduce a stress of thick spin-on dielectric layer by forming a sandwich dielectric structure, wherein a first dielectric layer is formed on a substrate by spin coating, a liquid phase deposited (LPD) silica layer is formed the first dielectric layer, and a second dielectric layer is formed on the LPD silica layer by spin coating. The LPD silica layer can be further subjected to a nitrogen plasma treatment to enhance its thermal stability and anti-water penetration ability.

7 Claims, 4 Drawing Sheets

US 6,774,461 B2

METHOD OF REDUCING THICK FILM STRESS OF SPIN-ON DIELECTRIC AND THE RESULTING SANDWICH DIELECTRIC STRUCTURE

FIELD OF THE INVENTION

The present invention relates to a semiconductor manufacturing process, and in particular to a method of reducing thick film stress of a spin-on dielectric and the resulting sandwich dielectric structure.

BACKGROUND OF THE INVENTION

Spin-on dielectric layers have been widely used to meet the planarization requirement, preventing a depth focus problem from occurring in the succeeding lithography process, and thus the accuracy of photo-patterning is improved. The planarization of spin-on dielectric layer in general requires a thick dielectric layer to be spin coated, while the stress of the dielectric layer is increased with the increment of the spin coating thickness. A spin-on dielectric layer will crack if its thickness/stress is too large, resulting in a high leaking current, and thus the dielectric layer loses the insulation characteristic. In order to avoid these drawbacks, a dielectric material was spin coated twice to obtain a thicker dielectric layer. Further, a dielectric layer having a low dielectric constant in general suffers a poor thermal stability and anti-water penetration ability, and thus there is a need to develop a technique to form a dielectric layer having enhanced properties.

U.S. Pat. No. 6,294,832 discloses a semiconductor device having a structure of copper interconnect/barrier dielectric liner/low-K dielectric trench and its fabrication method, in which a barrier dielectric liner made of a nitrogen-containing liquid-phase-deposition (LPD) fluorosilicate glass (FSG) film is used to replace a barrier metal layer and an oxide liner.

SUMMARY OF THE INVENTION

The present invention provides a technique to reduce a stress of thick spin-on dielectric layer by forming a sandwich dielectric structure, wherein a first dielectric layer is formed on a substrate by spin coating, a liquid phase deposited (LPD) fluorosilicate glass (FSG) layer is formed the first dielectric layer, and a second dielectric layer is formed on the LPD silica layer by spin coating. The LPD silica layer can be further subjected to a nitrogen plasma treatment so that the whole FSG film is nitridized to prevent movable ions from penetrating through, and enhance thermal stability and anti-water migration ability in effectiveness, and thus the reliability of the spin-on dielectric layer can be improved greatly. As a result, the spin-on dielectric layer will have a higher potential in more applications.

DETAILED DESCRIPTION OF THE INVENTION

Figure 1:
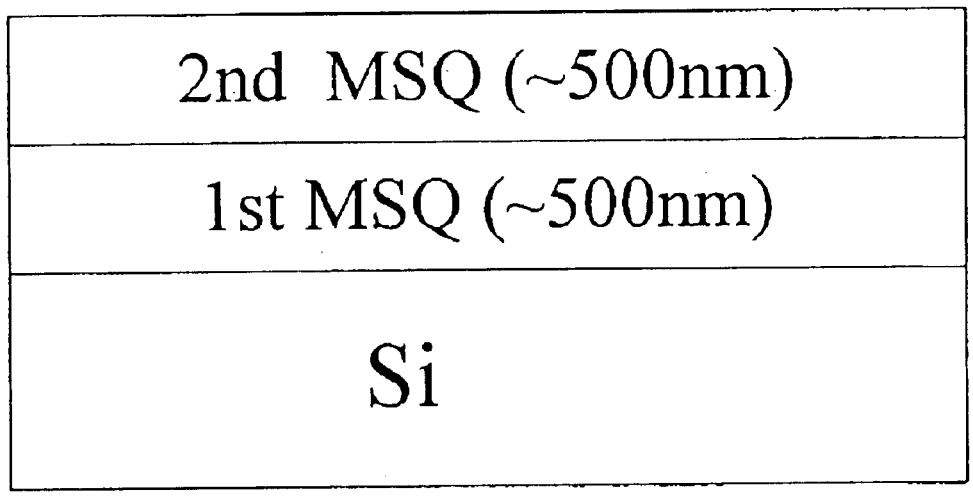
FIG. 1 is a cross sectional schematic view of a conventional methyl silsesquioxane (MSQ) dielectric layer prepared by a double spin coating method.

The present invention discloses a method for reducing thick film stress of spin-on dielectric comprising the following steps:

a) spin coating a first dielectric layer on a substrate;

b) growing a liquid-phase-deposition (LPD) silica layer on the first dielectric layer; and c) spin coating a second dielectric layer on the LPD silica layer.

Furthermore, the present invention discloses a sandwich dielectric structure having a reduced thick film stress comprising:

a first dielectric layer having a thickness between 100 to 700 nm formed on a substrate;

a liquid-phase-deposition (LPD) silica layer having a thickness between 5 to 100 nm formed on the first dielectric layer; and a second dielectric layer having a thickness between 100 to 700 nm formed on the liquid phase deposited (LPD) silica layer.

Preferably, the first dielectric layer and the second dielectric layer are a low-K dielectric layer selected from hydrogen silsesquioxane or methyl silsesquioxane (hereinafter abbreviated MSQ). Preferably, the first dielectric layer and the second dielectric layer are methyl silsesquioxane.

Preferably, the liquid-phase-deposition (LPD) silica layer is a fluorine-containing silica layer having 6–10 atom % of fluorine.

Preferably, the liquid-phase-deposition (LPD) silica layer is a liquid-phase-deposition (LPD) silica layer subjected to a nitrogen plasma treatment or $NH_3$ plasma treatment and has 3–50 atom % of nitrogen and 0.5–10 atom % of fluorine.

Preferably, the liquid-phase-deposition (LPD) silica layer has a thickness of 10 to 30 nm.

Preferably, the summation of the thickness of the first dielectric layer and the second dielectric layer are between 800 to 1200 nm.

Preferably, the method of the present invention prior to step c) further comprises:

b') thermal curing the resulting substrate/the first dielectric layer/the LPD silica layer structure from step b). More preferably, the thermal curing in step b') is carried out in a nitrogen atmosphere at a temperature ranging from 150 to 650° C. for a period of 30 minutes to 2 hours.

Preferably, the method of the present invention prior to step c) further comprises:

b') subjecting the LPD silica layer to a nitrogen plasma treatment or $NH_3$ plasma treatment. More preferably, the nitrogen plasma and the $NH_3$ plasma treatment is carried out under conditions of: 25–400° C., 10–800 mTorr, a RF power density of 0.2–2 W/cm$^2$, flow rate of nitrogen gas or $NH_3$ being 100–2000 sccm, and a period of treatment time ranging from 30 sec to 2 hours.

Preferably, step b) of the present invention comprises immersing the substrate into a silica-supersaturated hydrofluosilicic acid ($H_2SiF_6$) solution to form a fluorine-containing silica layer on the first dielectric layer for a period of time. A suitable method for preparing the silica-supersaturated $H_2SiF_6$ solution includes elevating a temperature of a silica-saturated $H_2SiF_6$ solution for 10° C. or above. Preferably, the temperature of the silica-saturated $H_2SiF_6$ solution is about 0° C., and the elevated temperature of the silica-supersaturated $H_2SiF_6$ solution is about 25° C. A suitable method for preparing the silica-saturated $H_2SiF_6$ solution includes adding a sufficient amount of silica powder into a $H_2SiF_6$ solution having a concentration between 0.5–5.0 M, stirring the resulting mixture at 0° C. for a period of time, and then filtering the mixture for removal of undissolved silica powder.

Preferably, the method of the present invention prior to the spin coating of the second dielectric layer in step c) further comprises heating and drying the LPD silica layer grown in step b).

Preferably, the method of the present invention before the thermal curing in step b') further comprises heating and drying the LPD silica layer grown in step b).

Preferably, the method of the present invention before the nitrogen plasma treatment or the $NH_3$ plasma treatment in step b') further comprises heating and drying the LPD silica layer grown in step b).

Preferably, the method of the present invention after the spin coating of the second dielectric layer in step c) further comprises thermal curing the resulting substrate/the first dielectric layer/the LPD silica layer/the second dielectric layer structure from step c). More preferably, this thermal curing is carried out in a nitrogen atmosphere at a temperature ranging from 150 to 650° C. for a period of 30 minutes to 2 hours.

CONTROL EXAMPLE 1

FIG. 1 shows a double coating structure of the conventional spin-on dielectric, which was prepared by spin coating a MSQ dielectric on a silicon substrate twice, each with a spin-coating thickness of 500 nm, and curing each MSQ dielectric layer in a nitrogen-flowing furnace tube at 400° C. for 30 minutes.

EXAMPLE 1

To prepare LPD FSG film, 80 g silica powder was first dissolved into 1500 ml of 4 M $H_2SiF_6$ solution at 0° C., and the resulting mixture was stirred for 24 hrs and filtered to removed the undissolved silica powder and obtain a silica-saturated $H_2SiF_6$ solution. As the silica-saturated $H_2SiF_6$ solution was heated in a constant temperature water bath at 25° C., supersaturation of silica occurred. The supersaturation of silica is caused by low solubility of silica in $H_2SiF_6$ solution at high temperature. The temperature of the constant temperature water bath was the temperature at which the FSG was grown.

Figure 2:
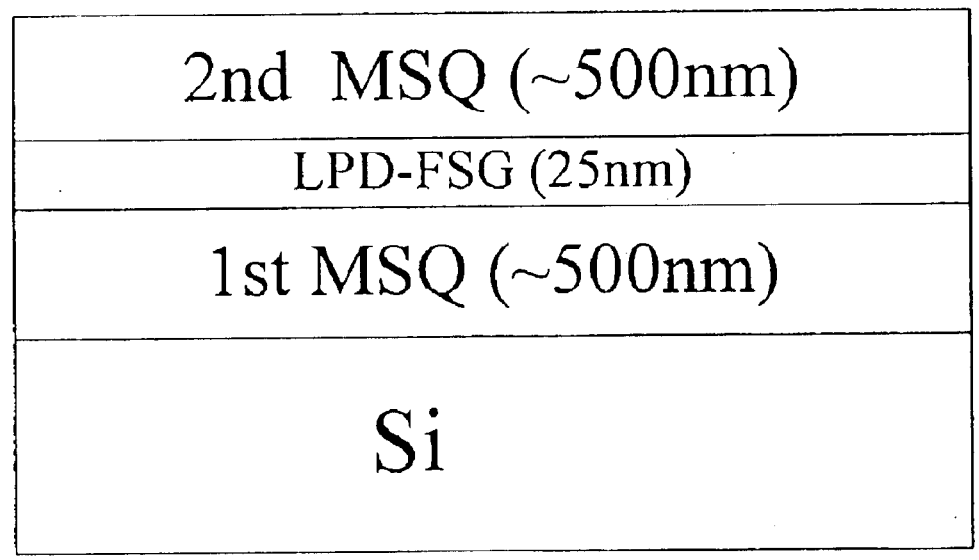
FIG. 2 is a cross sectional schematic view of a thick sandwich dielectric layer prepared by the method of the present invention.

MSQ dielectric material was coated on a silicon substrate by spin coating, so that a first MSQ dielectric layer having a thickness of about 500 nm was formed. The resulting substrate/MSQ dielectric layer was immersed into the supersaturated $H_2SiF_6$ solution at 25° C., and a LPD FSG was grown on the first MSQ dielectric layer to a thickness of about 25 nm. At this temperature, the deposition rate is about 20 nm/hr. The substrate/MSQ dielectric layer/LPD FSG layer structure so formed was removed from the supersaturated $H_2SiF_6$ solution, baked at 180° C. for one minute and 250° C. for another one minute, and subjected to a first curing treatment (400° C., 30 minutes). A second MSQ dielectric layer was then formed by spin coating followed by a second curing treatment (400° C., 30 minutes), and a structure as shown in FIG. 2 was obtained.

EXAMPLE 2

The procedures of Example 1 were repeated to obtain a substrate/MSQ dielectric layer/LPD FSG layer/MSQ dielectric layer structure, except that the first curing treatment was omitted.

A thin film stress measuring device (Tencor FLX-2908) was used to measure non-destructively the inner stresses in the layers formed at different steps of the preparation methods for the structures according to Control Example 1, Example 1 and Example 2. The measuring device includes a He—Ne laser source, a reflector, lenses, and a positioning sensor. By rotating the reflector, the laser light would scan the surface of the substrate/layer structure. Then the positioning sensor measured the shift of the reflecting light from the surface of the substrate/layer structure, and the curvature of the substrate/layer structure was obtained. The radius of curvatures $R_0$ and R of the substrate/layer structure before and after the deposition of a layer were measured, respectively. A stress in the thin film (σ) was calculated via the Stoney equation [Stoney 1909]:

$$\sigma = \frac{1}{6}\left(\frac{E_s}{(1-v_s)}\right)\left(\frac{t_s^2}{t_f}\right)\left(\frac{1}{R} - \frac{1}{R_0}\right)$$

where Es, $t_s$, and $v_s$ are Young's Modulus, thickness and Poisson ration of the substrate, and $t_f$ is the thickness of the thin film. The results are shown in FIG. 3.

Figure 3:
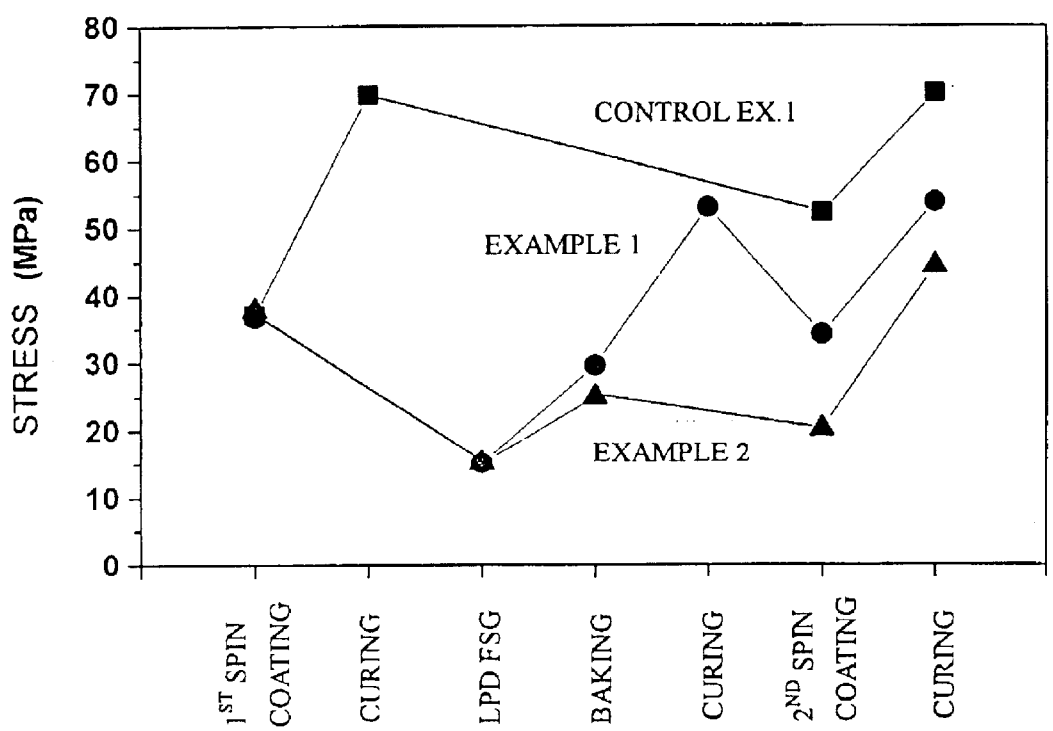
FIG. 3 shows the stress of the layers at different steps of the methods according to Examples 1 and 2 of the present invention and Control Example 1.

It can be found in FIG. 3 that, for Examples 1 and 2 having a LPD-FSG sandwiched between MSQ dielectric layers, the final thin film stresses are 53.9 Mpa and 44.4 Mpa, respectively, which are significantly lower than 70 MPa of the stress of the double coating structure in Control Example 1. Therefore, the LPD-FSG has an effect of reducing the stress of the thick film.

In another embodiment of the present invention, the LPD FSG layer having a thickness of 25 nm on the first MSQ dielectric layer was placed in a PECVD reactor, where a nitrogen plasma treatment was carried out for a nitridation of the LPD FSG layer under the following conditions: flow rate of $N_2$ of 200 s.c.c.m; process temperature 200° C.; temperature of the upper plate 250° C.; RF energy density 1.13 W/cm$^2$; pressure 400 mTorr; and process time 15 minutes. MSQ material was further spin coated on the LPD-FSG so as to form a sandwich structure of MSQ/LPD FSG/MSQ. Finally, the structure was placed in a furnace tube with a nitrogen flow for curing (400° C., 30 minutes).

Figure 4A:
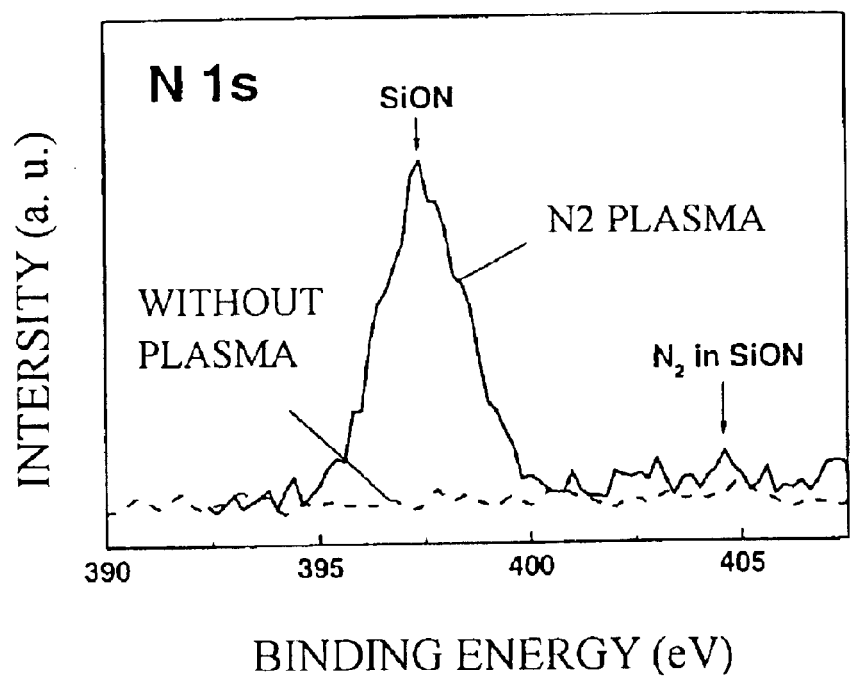
FIG. 4(a) shows ESCA spectra of N 1s for LPD FSG films with/without nitrogen plasma treatment.
Figure 4B:
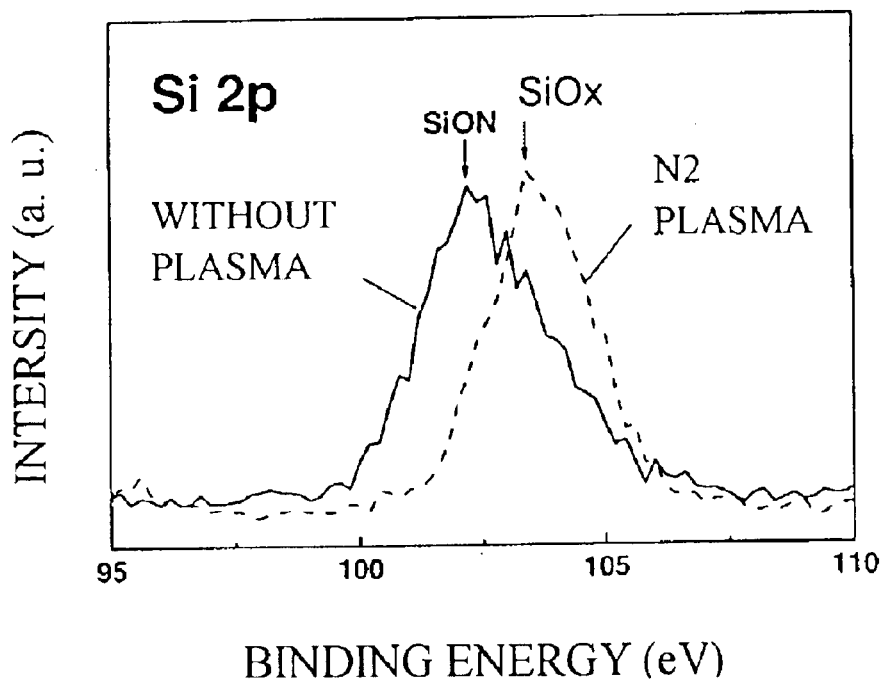
FIG. 4(b) shows ESCA spectra of Si 2p for LPD FSG films with/without nitrogen plasma treatment.

FIGS. 4(a) and 4(b) shows the surface chemical composition and chemical shifts of the LPD FSG layers with/without nitrogen plasma treatment by using Electron Spectroscopy for Chemical Analysis (ESCA). It can be seen from the spectra of nitrogen atom bonding (N 1s) in FIG. 4(a) that the LPD FSG layer without nitrogen plasma treatment (represented by the dashed line) does not have any nitrogen bonding therein. On the contrary, the LPD FSG layer with nitrogen plasma treatment has an intense peak at the binding energy of 397.4 eV, which is just within N 1s peak position range of 396.97–397.82 eV for SiON film. From the spectra of silicon atom bond (Si 2p) in FIG. 4(b), it can be seen that the LPD FSG layer without nitrogen plasma treatment has an intense peak at the binding energy of about 103.4 eV, which is mainly attributed by silicon oxide ($SiO_x$) bond. The LPD FSG layer with nitrogen plasma treatment has an intense peak at the binding energy of about 102.2 eV, which is primarily attributed by SiON bond. From above it is known that the intense peak of Si 2p spectra of the LPD FSG layer after the nitrogen plasma treatment is changed from 103.4 eV to 102.2 eV. This is mainly because part of the Si—F bonds and Si—O bonds in the as-grown layer are changed to Si—N bonds after the nitrogen plasma treatment, wherein nitrogen atoms permeate into the as-grown layer and replace some of the oxygen or fluorine atoms therein. Further, nitrogen atom has an electron affinity smaller than those of oxygen atom and fluorine atom, therefore the intense peak of Si 2p spectra of the LPD FSG layer with nitrogen plasma treatment shifts toward a smaller binding energy.

Figure 5:
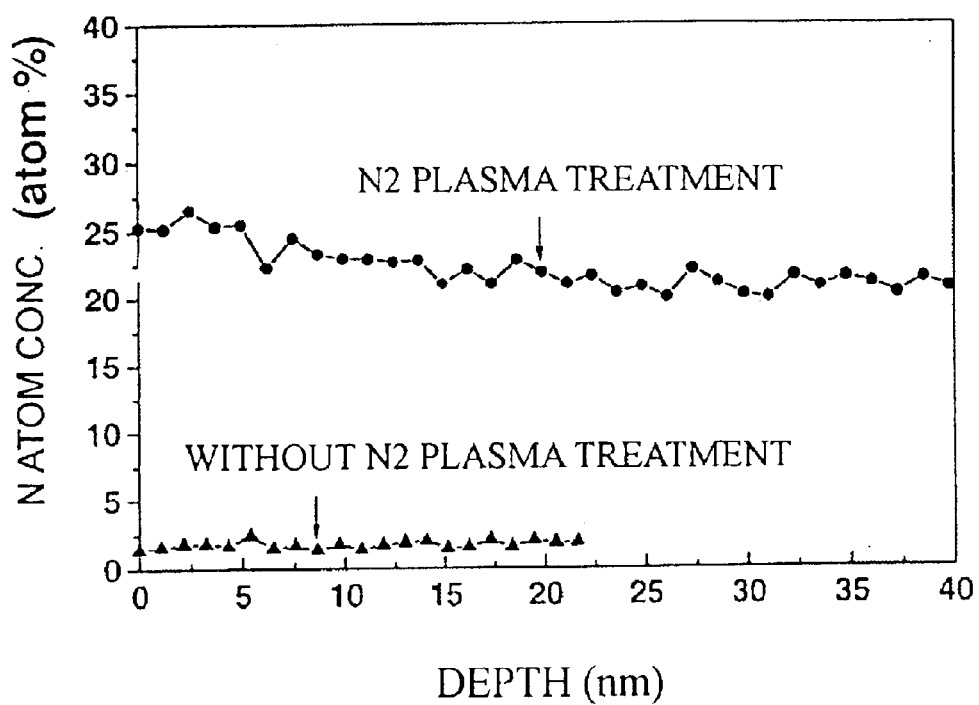
FIG. 5 shows nitrogen concentration depth profiles of LPD FSG film with/without nitrogen plasma treatment by ESCA.

FIG. 5 shows nitrogen concentration depth profiles of LPD FSG layer with/without nitrogen plasma treatment by ESCA. It can be seen from this figure that nitrogen atom can be detected along the depth from the surface of the layer to the silicon substrate after the nitrogen plasma treatment, and the density thereof is maintained above 20 atom %. No nitrogen atom is substantially detected from the LPD FSG layer without nitrogen plasma treatment, wherein the concentrations there measured are close to noise values. It can be understood from the data in FIGS. 4 and 5 that nitrogen atom can uniformly penetrate into the LPD FSG layer by subjecting the LPD FSG layer to a nitrogen plasma treatment, and nitrogen can replace oxygen or fluorine to form N—Si bond. As a result, the effect of nitrogen plasma treatment is not restricted to the surface, but a nitridation of the whole layer.

LPD FSG and MSQ dielectric materials are both low-K dielectric materials, and a combination of them can result in a decrease in the stress in the dielectric thick film and a reduce in RC delay thereof. Furthermore, the defects of high water absorption and poor thermal stability of MSQ film can be improved, and thus the oxidization and even erosion of metal conductive wires can also be improved. Therefore, the present invention has a great potential to be used in many applications in the future semiconductor manufacturing processes.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A sandwich dielectric structure having a reduced thick film stress comprising:
   a first dielectric layer having a thickness between 100 to 700 nm formed on end contiguous with a substrate;
   a liquid-phase-deposition (LPD) silica layer having a thickness between 5 to 100 nm formed on and contiguous with the first dielectric layer; and
   a second dielectric layer having a thickness between 100 to 700 nm formed on and contiguous with the liquid phase deposited (LPD) silica layer.

2. The structure according to claim 1, wherein said first dielectric layer and said second dielectric layer are a low-K dielectric material of methyl silsesquioxane (IV SQ), or hydrogen silsesquioxane (HSQ).

3. The structure according to claim 2, wherein said first dielectric layer and said second dielectric layer are methyl silsesquioxane (MSQ).

4. The structure according to claim 1, wherein said LPD silica layer is a fluorine-containing silica layer comprising 6–10 atom % of fluorine.

5. The structure according to claim wherein said LPD silica layer is a fluorine-containing silica layer and said fluorine-containing silica layer is subjected to a nitrogen plasma treatment or $NH_3$ plasma treatment, so that the treated fluorine-containing silica layer comprises 3–50 atom % of nitrogen and 0.5–10 atom % of fluorine.

6. The structure according to claim 1, wherein the LPD silica layer has a thickness between 10 to 30 nm.

7. The structure according to claim 1, wherein a summation of the thickness of the first dielectric layer and the thickness of the second dielectric layer are between 800 to 1200 nm.

* * * * *